United States Patent
Naba et al.

(10) Patent No.: US 10,952,317 B2
(45) Date of Patent: Mar. 16, 2021

(54) CERAMIC CIRCUIT BOARD AND SEMICONDUCTOR MODULE

(71) Applicants: KABUSHIKI KAISHA TOSHIBA, Tokyo (JP); TOSHIBA MATERIALS CO., LTD., Yokohama (JP)

(72) Inventors: Takayuki Naba, Chigasaki Kanagawa (JP); Hiromasa Kato, Nagareyama Chiba (JP); Keiichi Yano, Yokohama Kanagawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 0 days.

(21) Appl. No.: 16/781,741

(22) Filed: Feb. 4, 2020

(65) Prior Publication Data

US 2020/0178387 A1 Jun. 4, 2020

Related U.S. Application Data

(63) Continuation of application No. 16/246,106, filed on Jan. 11, 2019, now Pat. No. 10,595,403, which is a (Continued)

(30) Foreign Application Priority Data

Jul. 14, 2016 (JP) ............................. JP2016-139735

(51) Int. Cl.
*H05K 1/03* (2006.01)
*H01L 23/13* (2006.01)
(Continued)

(52) U.S. Cl.
CPC .......... *H05K 1/0306* (2013.01); *B23K 1/0016* (2013.01); *C04B 37/02* (2013.01); (Continued)

(58) Field of Classification Search
CPC ............ H01L 25/0657; H01L 23/3128; H01L 23/49811; H01L 23/3735; H01L 23/36; (Continued)

(56) References Cited

U.S. PATENT DOCUMENTS 5,379,942 A 1/1995 Kuhnert et al.
5,691,467 A * 11/1997 Goldmann ............. G01B 7/287
73/105
(Continued)

FOREIGN PATENT DOCUMENTS

CN 105452194 A 3/2016
EP 3031789 A1 6/2016
(Continued)

OTHER PUBLICATIONS

Mitutoyo America Corporation, "Quick Guide to Surface Roughness Measurement", Bulletin 2229, Dec. 2016.
(Continued)

*Primary Examiner* — Adam B Dravininkas
(74) *Attorney, Agent, or Firm* — Harness, Dickey & Pierce, P.L.C.

(57) ABSTRACT

A ceramic circuit board comprises: a ceramic substrate with a 1.0 mm thickness or less including a first surface and a second surface, the first surface including a first area and a second area; a first metal plate joined to the first area; and a second metal plate joined to the second surface. The second area has a first waviness profile along a first side of the first surface, the first waviness profile having one extreme value or less. The second area has a second waviness profile along a second side of the first surface, the second waviness profile has not less than two nor more than three extreme values.

17 Claims, 4 Drawing Sheets

Related U.S. Application Data continuation of application No. PCT/JP2017/025729, filed on Jul. 14, 2017.

(51) Int. Cl.
*H01L 23/15* (2006.01)
*C04B 37/02* (2006.01)
*H01L 23/36* (2006.01)
*H05K 1/02* (2006.01)
*B23K 1/00* (2006.01)
*H01L 23/373* (2006.01)

(52) U.S. Cl.
CPC .............. *H01L 23/13* (2013.01); *H01L 23/15* (2013.01); *H01L 23/36* (2013.01); *H01L 23/3735* (2013.01); *H05K 1/02* (2013.01); *H05K 1/0201* (2013.01)

(58) Field of Classification Search
CPC ....... H01L 23/15; H01L 23/13; H05K 3/3436; H05K 2201/10674; H05K 2203/043; H05K 3/3484; H05K 2203/063; H05K 2201/0949; H05K 2201/09536; H05K 2201/0959; H05K 3/462; H05K 2201/10734; H05K 2203/0733; H05K 3/28; H05K 1/0306; H05K 1/0201; H05K 1/02; B23K 1/0016; C04B 37/02
See application file for complete search history.

(56) References Cited

U.S. PATENT DOCUMENTS

| | | | |
|---|---|---|---|
| 5,981,036 A | 11/1999 | Schulz-Harder et al. | |
| 6,787,900 B2 | 9/2004 | Shinohara et al. | |
| 7,728,231 B2 | 6/2010 | Matsui et al. | |
| 8,283,211 B2 * | 10/2012 | Lin | H01L 33/642 |
| | | | 438/122 |
| 2002/0060091 A1 * | 5/2002 | Naba | H01L 23/15 |
| | | | 174/257 |
| 2002/0084103 A1 * | 7/2002 | Komatsu | H01L 23/15 |
| | | | 174/255 |
| 2004/0192070 A1 * | 9/2004 | Tateishi | H01L 51/0013 |
| | | | 438/780 |
| 2006/0202219 A1 * | 9/2006 | Ohashi | H01L 51/0013 |
| | | | 438/780 |
| 2008/0043127 A1 | 2/2008 | Mochizuki et al. | |
| 2008/0290512 A1 * | 11/2008 | Uchida | H01L 24/16 |
| | | | 257/737 |
| 2011/0065241 A1 | 3/2011 | Lin et al. | |
| 2012/0168209 A1 * | 7/2012 | Kato | H01L 23/15 |
| | | | 174/255 |
| 2013/0135824 A1 * | 5/2013 | Harubeppu | H01L 23/34 |
| | | | 361/709 |
| 2014/0198393 A1 | 7/2014 | Sugita | |
| 2014/0291385 A1 | 10/2014 | Kato | |
| 2014/0376694 A1 | 12/2014 | Abe et al. | |
| 2015/0034367 A1 * | 2/2015 | Nagatomo | B23K 1/012 |
| | | | 174/252 |
| 2016/0079195 A1 * | 3/2016 | Tanaka | H01L 24/090 |
| | | | 257/737 |
| 2016/0120017 A1 | 4/2016 | Momoi et al. | |
| 2017/0263582 A1 | 9/2017 | Maeda et al. | |

FOREIGN PATENT DOCUMENTS

| | | |
|---|---|---|
| JP | 2004134703 A | 4/2004 |
| JP | 2006019494 A | 1/2006 |
| KR | 20160030562 A | 3/2016 |
| WO | WO-2011034075 A1 | 3/2011 |
| WO | WO-2015019602 A1 | 2/2015 |

OTHER PUBLICATIONS

International Search Report and Written Opinion in corresponding International Patent Application No. PCT/JP2017/025729 dated Sep. 12, 2017, in Japanese.

* cited by examiner

CERAMIC CIRCUIT BOARD AND SEMICONDUCTOR MODULE

CROSS-REFERENCE TO RELATED APPLICATIONS

This application is a continuation of prior U.S. patent application Ser. No. 16/246,106, filed Jan. 11, 2019 (now U.S. Pat. No. 10,595,403, issued Mar. 17, 2020), which claims the benefit of priority from prior International Application No. PCT/JP2017/025729, filed on Jul. 14, 2017, which is based upon and claims the benefit of priority from Japanese Patent Application No. 2016-139735 filed on Jul. 14, 2016; the entire contents of the above applications are incorporated herein by reference.

FIELD

Embodiments described herein generally relate to a ceramic circuit board and a semiconductor module.

BACKGROUND

In recent years, with a performance improvement of industrial apparatuses, the outputs of power modules mounted thereon have been becoming higher. Accordingly, the outputs of semiconductor elements have been becoming higher. Operation guaranteed temperatures of semiconductor elements are, for example, not lower than 125° C. nor higher than 150° C. It is expected that the operation guaranteed temperatures will increase to 175° C. or higher in the future.

The increase in the operation guaranteed temperatures of semiconductor elements requires that circuit boards should have high thermal cycle test (TCT) characteristics. In TCT, low temperature→room temperature→high temperature→room temperature is one cycle and durability of a ceramic circuit board is measured.

There has been disclosed a ceramic circuit board having no void in a protruding portion of a brazing material. It is described that a ceramic circuit board having a silicon nitride substrate has 5000 cycle-durability. By eliminating the void in the protruding portion of the brazing material, it is possible to improve the TCT characteristics. However, with the performance improvement of semiconductor elements, it is expected that the operation guaranteed temperature will increase to 175° C. or higher.

Meanwhile, with the performance improvement of semiconductor elements, studies are made on the use of a large external terminal in order to increase ampacity. It is known that the thickness of a joined portion of a conventional external terminal is set to 3 mm or more.

External terminals include those having various shapes such as a lead frame and a lead pin. To increase the ampacity, using a relatively thick lead frame instead of a thin wire such as a bonding wire is effective. The use of the thick lead frame, however, may cause the ceramic circuit board to greatly curve. If the ceramic circuit board curves, poor mounting is likely to occur when it is mounted on a heat dissipation member. Further, when the ceramic circuit board having lead terminals is subjected to TCT whose temperature in the high temperature state is 175° C., it is difficult to obtain good characteristics. This is because a higher stress is applied to the ceramic circuit board as the lead frame is thicker. Under such circumstances, there is required a ceramic circuit board with good TCT characteristics that does not curve even when a thick lead frame and a terminal are joined thereto.

DETAILED DESCRIPTION

A ceramic circuit board according to an embodiment comprises: a ceramic substrate with a 1.0 mm thickness or less including a first surface and a second surface, the first surface including a first area and a second area; a first metal plate joined to the first area; and a second metal plate joined to the second surface. The second area has a first waviness profile along a first side of the first surface, the first waviness profile having one extreme value or less. The second area has a second waviness profile along a second side of the first surface, the second waviness profile has not less than two nor more than three extreme values.

Figure 1:
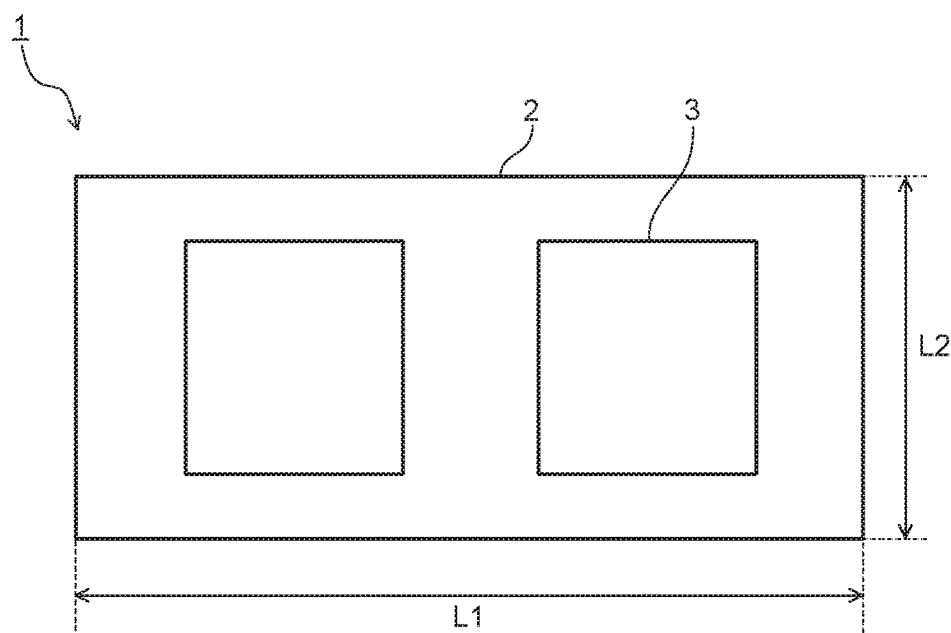
FIG. 1 is a top view illustrating an example of a ceramic circuit board.
Figure 2:
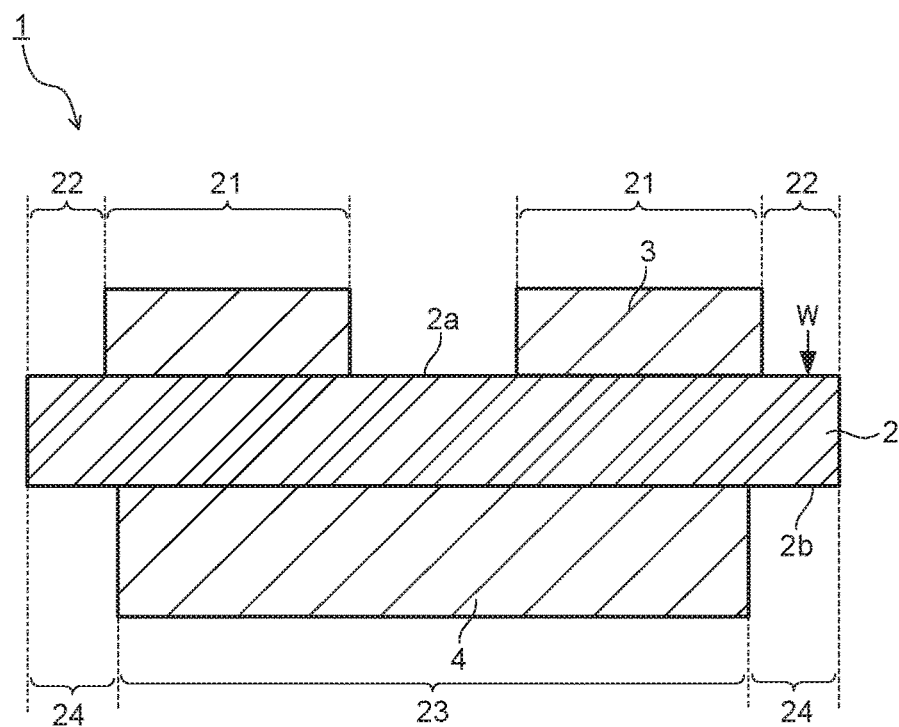
FIG. 2 is a side view illustrating another example of the ceramic circuit board.

FIG. 1 illustrates an example of a top surface of a ceramic circuit board according to an embodiment. FIG. 2 illustrates an example of a side surface of the ceramic circuit board according to the embodiment. FIG. 1 illustrates a ceramic circuit board 1, a ceramic substrate 2, metal plates (front metal plates 3 and a rear metal plate 4), a length L1 of a long side of the ceramic substrate 2, a length L2 of a short side of the ceramic substrate 2, and a place W where waviness profiles are measured. FIG. 1 and FIG. 2 illustrate an example where the ceramic circuit board 1 has two front metal plates 3 and one rear metal plate 4. A structure of the ceramic circuit board according to the embodiment is not limited to the above-described structure, and for example, the ceramic circuit board 1 may have one front metal plate 3 or three front metal plates 3 or more. Similarly, the ceramic circuit board 1 may have two rear metal plates 4 or more.

The ceramic substrate 2 has a surface 2a and a surface 2b facing each other The surface 2a and the surface 2b each extend in a first direction and a second direction. The second direction intersects with the first direction. In a case where the surface 2a and the surface 2b are each, for example, a rectangular surface, the first direction is, for example, a long-side direction of the rectangle and the second direction is, for example, a short-side direction of the rectangle.

The surface 2a includes areas 21 for receiving the front metal plates 3 and an area 22 around the areas 21. The area 22 extends from the areas 21 to end portions of the surface 2a, for instance. Incidentally, in a case where the plurality of front metal plates 3 are joined to the ceramic substrate 2, the area 22 may include an area between the plurality of front metal plates 3. The surface 2b may have an area 23 for receiving the rear metal plate 4 and an area 24 around the area 23. For example, the area 23 extends from the area 23 to end portions of the surface 2b. Incidentally, in a case where the plurality of rear metal plates 4 are joined to the ceramic substrate 2, the area 24 may include an area between the plurality of rear metal plates 4.

The ceramic substrate 2 preferably has a 1.0 mm thickness or less. If the thickness of the ceramic substrate 2 is over 1.0 mm, it is difficult to achieve predetermined waviness profiles. Reducing the thickness of the ceramic substrate 2 facilitates achieving the predetermined waviness profiles. The ceramic substrate 2 preferably has a three-point bending strength of 500 MPa or more. Using a ceramic substrate whose three-point bending strength is 500 MPa or more allows to thin the substrate to 0.4 mm or less. Examples of the ceramic substrate whose three-point bending strength is 500 MPa or more include a silicon nitride substrate. Examples of the aforesaid ceramic substrate include a highly strengthened aluminum nitride substrate, a highly strengthened alumina substrate, and a highly strengthened zirconia-containing alumina substrate.

As the ceramic substrate, the silicon nitride substrate is particularly preferable. The three-point bending strength of ordinary aluminum nitride substrate and alumina substrate is about 300 to 450 MPa. Thinning a substrate whose strength is less than 500 MPa to 0.4 mm or less leads to inferior TCT characteristics. Especially when the temperature of the high-temperature state of TCT is increased to 175° C. or higher, durability becomes inferior. As the silicon nitride substrate, there is a high-strength silicon nitride substrate whose three-point bending strength is 500 MPa or more or further 600 MPa or more. As the silicon nitride substrate, there is a silicon nitride substrate whose heat conductivity is 50 W/m·K or more or further 80 W/m·K or more. In recent years, a silicon nitride substrate having both high strength and high heat conductivity has also become available. A silicon nitride substrate having a three-point bending strength of 500 MPa or more and a heat conductivity of 80 W/m·K or more can be thinned to 0.33 mm or less. The three-point bending strength is measured according to JIS-R-1601, and the heat conductivity is measured according to JIS-R-1611.

The front metal plates 3 are joined to the areas 21. The rear metal plate 4 is joined to the area 23. That is, the areas 21 are areas, in the surface 2a, which are joined to the front metal plates 3. The area 23 is an area, in the surface 2b, which is joined to the rear metal plate 4. The front metal plates 3 and the rear metal plate 4 each preferably contain copper, aluminum, or an alloy whose main component is either of these. These metal plates are conveniently used for a circuit owing to their low electric resistance. In addition, copper and aluminum are both high in heat conductivity and have 398 W/m·K heat conductivity and 237 W/m·K heat conductivity respectively. Accordingly, a heat dissipation property can be improved. It is preferable to set the thickness of the metal plates (the front metal plates 3 and the rear metal plate 4) to 0.6 mm or more, further 0.8 mm or more, by making use of these properties. By thickening the metal plates, it is possible both to increase the ampacity and to improve the heat dissipation property. An upper limit of the thickness of each of the metal plates is not limited, but its thickness is preferably 5 mm or less. The metal plates, if having a large thickness of over 5 mm, lead to a size increase of a semiconductor module when lead terminals are attached. Examples of a method to join the ceramic substrate and the metal plates include a method which joins them with a joining layer therebetween and a method which directly joins them without a joining layer therebetween. Incidentally, in order to improve the TCT characteristics, the structure with the joining layer interposed is preferable as will be described later.

A waviness profile of the area 22 measured along a first side extending in the first direction of the surface 2a (first waviness profile) has one extreme value or less. That is, the number of the extreme values of this waviness profile is one. A waviness profile of the area 22 measured along a second side extending in the second direction of the surface 2a (second waviness profile) has not less than two nor more than three extreme values. That is, the number of the extreme values of this waviness profile is two or three. These extreme values are each a maximum value or a minimum value. A waviness profile measured along the first side of the surface 2b may have one extreme value or more, and a waviness profile measured along the second side of the surface 2b may have not less than two nor more than three extreme values.

In the case where the surface 2a is a rectangular surface, it is preferable that one of the waviness profile of a creepage distance of the long side of the surface 2a and the waviness profile of a creepage distance of the short side thereof is substantially arc-shaped and the other is substantially M-shaped or substantially S-shaped. The creepage distance means a ceramic surface ranging from the end of the surface 2a to the outermost periphery of a pattern (for example, a copper plate) of the front metal plate 3.

The waviness profile is measured according to JIS-B0601. The waviness profile is a profile obtained by sequentially applying profile filters whose cutoff values are λf and λc to a primary profile, and is different from a roughness profile. Examples of a measurement method include a laser method and a contact method. The waviness profile of the creepage distance of the long side of the surface 2a is measured. The measurement along the long side is preferably conducted at a time. If the measurement at a time is not possible due to a substrate size or a device size, the measurement is conducted in a divided manner on a plurality of portions, and the results are defined as measurement values of one waviness profile. The same applies to the short side. Further, the same applies to the measurement of the waviness profiles of the surface 2b. Further, the measurement place of the waviness profile is within a range of 0.5 to 1 mm from the end portion of the ceramic substrate 2.

Figure 3:
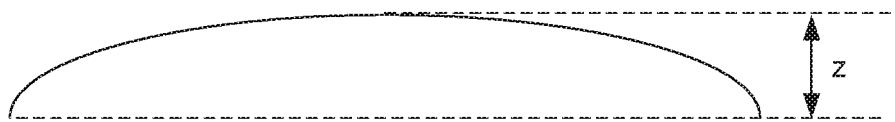
FIG. 3 is a chart illustrating an example of a waviness profile.
Figure 4:
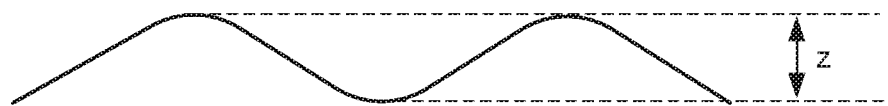
FIG. 4 is a chart illustrating another example of the waviness profile.
Figure 5:
FIG. 5 is a chart illustrating still another example of the waviness profile.

One of the waviness profile of the creepage distance of the long side of the surface 2a and the waviness profile of the creepage distance of the short side of thereof is substantially arc-shaped and the other is substantially M-shaped or substantially S-shaped. FIG. 3 to FIG. 5 illustrate examples of the waviness profile. FIG. 3 illustrates an example of the substantially arc-shaped waviness profile. FIG. 4 illustrates an example of the substantially M-shaped waviness profile. FIG. 5 illustrates an example of the substantially S-shaped waviness profile.

The substantially arc shape is a shape gradually curving up and curving down at a point past the maximum point (highest point). In this case, an extreme point is only at one place. The extreme point may be either on a front surface side or on a rear surface side. Incidentally, if the extreme point is on the rear surface side, this shape is a shape gradually curving down and then curving up at a point past the minimum point (lowest point). Further, start and end portions of the waviness profile may spread like the skirts of a mountain. That is, the substantially arc shape is a shape of the waviness profile having one extreme value.

The substantially M-shape is a shape gradually curving up, descending at a point past a first maximum point (highest point), ascending again at a point past a minimum point (lowest point), and descending at a point past a second maximum point (highest point). This is a curved shape presenting the highest point (first maximum point)→the lowest point (minimum point)→the highest point (second maximum point). Further, the highest points and the lowest point may be reversed. The shape in this case is a substantially W-shape. Therefore, the substantially M-shape includes the substantially W-shape as well. Further, start and end portions of the waviness profile may spread like the skirts of a mountain. That is, the substantially M-shape is a shape of the waviness profile having three extreme values.

The substantially S-shape is a shape gradually curving up, descending at a point past a maximum point (highest point), and ascending again at a point past a minimum point (lowest point). This is a curved shape presenting the highest point→the lowest point. The highest point and the lowest point may be reversed. Further, start and end portions of the waviness profile may spread like the skirts of a mountain. That is, the substantially S-shape is a shape of the waviness profile having two extreme values.

It is preferable that the first waviness profile has the substantially arc shape and the second waviness profile has the substantially M-shape or the substantially S-shape. In the case where the surface $2a$ is a rectangular surface, the surface $2a$ has two long sides facing each other. Out of the two first waviness profiles measured along the two long sides, preferably, at least one of the first waviness profiles extends in the substantially arc shape, and more preferably, the two first waviness profiles extend in the substantially arc shape. The two first waviness profiles measured along the two facing long sides only need to extend in the substantially arc shape, and they do not necessarily have to have completely the same shape.

Out of the two second waviness profiles, preferably, at least one second waviness profile extends in the substantially M-shape or the substantially S-shape, and more preferably, the two second waviness profiles extend in the substantially M-shape or the substantially S-shape. The two second waviness profiles only need to extend in the substantially M-shape or the substantially S-shape, and they do not necessarily have to have completely the same shape. In the case where one of the second waviness profiles extends in the substantially M-shape, preferably, the other second waviness profile also extends in the substantially M-shape. Similarly, in the case where one of the second waviness profiles extends in the substantially S-shape, preferably, the other second waviness profile also extends in the substantially S-shape.

FIGS. 3 to 5 each also show a difference Z between the maximum value and the minimum value of the waviness profile. The difference Z between the maximum value and the minimum value of the waviness profile is preferably 10 µm or more. The maximum value is the largest value out of the highest points of the waviness profile. Further, the minimum value is the smallest value out of the lowest points of the waviness profile. The difference Z between the maximum value and the minimum value of the waviness profile is preferably 10 µm or more, and more preferably 50 µm or more. Increasing the difference Z between the maximum value and the minimum value of the waviness profile makes it possible to reduce waviness of the ceramic substrate 2 after the lead terminals are joined. The largest value of the difference Z between the maximum value and the minimum value of the waviness profile is not limited, but is preferably 400 µm or less. If it is over 400 µm, the waviness of the ceramic substrate 2 is large and accordingly the waviness remains after the lead terminals are joined, which may result in inferior mountability on a heat dissipation member.

A ratio of the thickness of the ceramic substrate 2/the thickness of the metal plate is preferably 1.5 or less. In a case where a plurality of metal plates including the front metal plates 3 and the rear metal plate 4 are joined to the ceramic substrate 2, the aforesaid ratio is calculated using the thickness of the thickest metal plate out of these. That is, the thickness of the thickest metal plate is preferably 1.5 times or less, and more preferably 0.5 times or less as large as the thickness of the ceramic substrate 2. That the ratio of the thickness of the ceramic substrate 2/the thickness of the metal plate is 0.5 or less means thinning the ceramic substrate 2 or thickening the metal plate. This can facilitate controlling the waviness profiles. A ratio of the length L1 of the long side and the length L2 of the short side (L1/L2) of the ceramic substrate preferably satisfies (L1/L2)≥1.25. That is, L1 is preferably 1.25 times or more as long as L2. The longer the long side of the substrate, the more easily desired waviness can be imparted.

When the thickness of the ceramic substrate 2 is 0.4 mm or less and the thickness of the metal plate is 0.6 mm or more, it is preferable that the waviness profile of the creepage distance of the long side has the substantially arc shape and the waviness profile of the creepage distance of the short side thereof has the substantially M-shape. With this shape, the ceramic substrate 2 has a symmetric waviness structure, making it possible to reduce differences between the maximum values and the minimum values of waviness profiles of the ceramic substrate 2 after the lead terminals are joined. Further, in a case of a silicon nitride substrate, its thickness can be reduced to 0.33 mm or less, further to 0.30 mm or less. Reducing the thickness of the ceramic substrate 2 to 0.4 mm or less facilitates controlling the waviness profiles.

Figure 6:
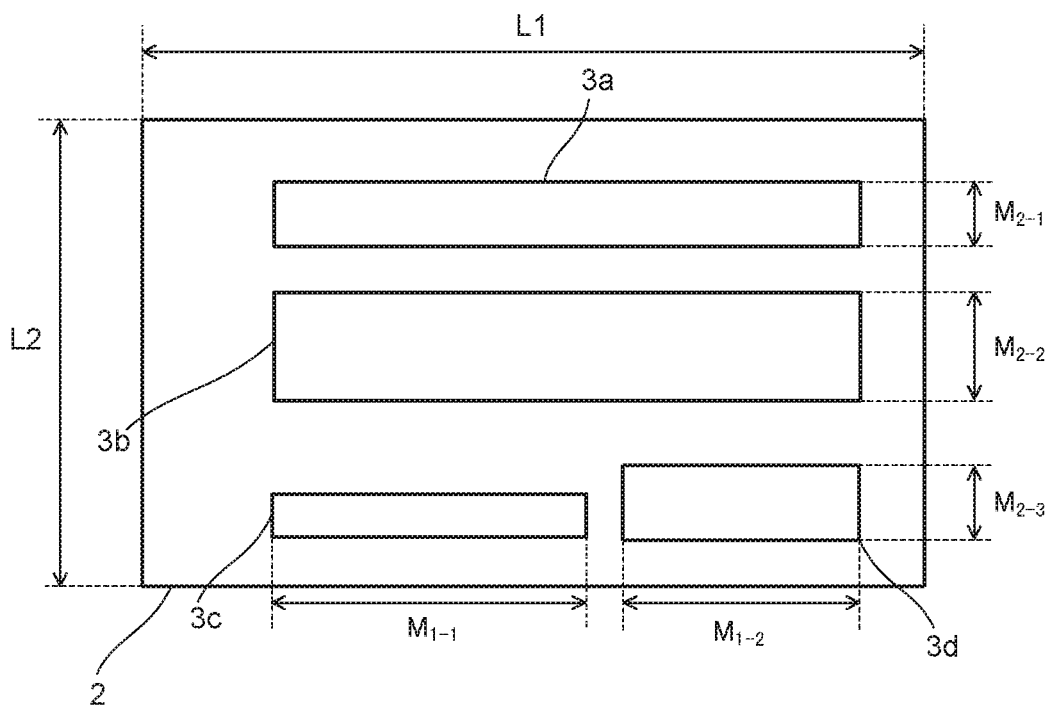
FIG. 6 is a view illustrating an example of an arrangement structure of metal plates.

In order to control the first waviness profile of the creepage distance of the long side of the ceramic substrate 2 and the second waviness profile of the creepage distance of the short side thereof, it is also effective to adjust an arrangement structure of the metal plates. FIG. 6 is a view illustrating an example of the arrangement structure of the metal plates. FIG. 6 illustrates the ceramic substrate 2, a metal plate $3a$, a metal plate $3b$, a metal plate $3c$, and a metal plate $3d$ which are the front metal plates 3, the length L1 of the long side of the ceramic substrate 2, the length L2 of the short side of the ceramic substrate 2, a length $M_{1-1}$ of a long side of the metal plate $3c$, a length $M_{1-2}$ of a long side of the metal plate $3d$, a length $M_{2-1}$ of a short side of the metal plate $3a$, a length $M_{2-2}$ of a short side of the metal plate $3b$, and a length $M_{2-3}$ of a short side of the metal plate $3d$.

Let the total length of the long sides of the metal plates be $\Sigma M_n$, a ratio of $\Sigma M_n$ to L1 preferably satisfies $0.50 \leq \Sigma M_n/L1 \leq 0.95$. $\Sigma M_n$ is the sum of the lengths of the metal plates closest to the creepage distance of the long side of the ceramic substrate 2. n is determined by the number of the relevant metal plates. In FIG. 6, the metal plate $3c$ and the metal plate $3d$ are closest to the creepage distance of the long side of the ceramic substrate 2. Therefore, $\Sigma M_n$ is the sum of $M_{1-1}+M_{1-2}$. Let the length of one metal plate be M, $M/L1 \leq 0.5$ is preferably satisfied. In FIG. 6, the metal plate $3c$ and the metal plate $3d$ are illustrated, but the number of the metal plates may be three or more.

Let the sum of the lengths of the short sides of the metal plates be $\Sigma M_m$, a ratio of $\Sigma M_m$ to L2 preferably satisfies $0.50 \leq \Sigma M_m/L2 \leq 0.95$. $\Sigma M_m$ is the total value of the lengths of the metal plates closest to the creepage distance of the short side of the ceramic substrate 2. n is determined by the number of the relevant metal plates. In FIG. 6, the metal plates 3a, 3b, 3d are closest to the creepage distance of the short side of the ceramic substrate 2. Therefore, $\Sigma M_m$ is the sum of $M_{2-1}$, $M_{2-2}$, and $M_{2-3}$. Let the length of one metal plate be M, $M/L2 \leq 0.5$ is preferably satisfied. In FIG. 6, the metal plate 3a, the metal plate 3b, and the metal plate 3d are illustrated, but the number of the metal plates may be four or more.

Controlling the $\Sigma M_n$ value, the $\Sigma M_m$ value, and the M values, with respect to the lengths L1, L2 of the ceramic substrate 2 makes it possible to control the shapes of the waviness profiles. This makes it possible for the waviness profiles to have desired shapes even if the number of the arranged metal plates increases to three or more. That is, it is possible to control the waviness profiles even in a complicated pattern shape where the number of the arranged front metal plates 3 is three or more.

FIG. 6 illustrates the three metal plates (3a, 3b, 3d) provided along the creepage distance of the short side of the ceramic substrate 2. There is a gap between the metal plate 3a and the metal plate 3b, and between the metal plate 3b and the metal plate 3d. The extreme values of the waviness profile are easily formed in the gaps. The same applies to the long side. Out of $0.50 \leq \Sigma M_n/L1 \leq 0.95$, $0.50 \leq \Sigma M_m/L2 \leq 0.95$, $M/L1 \leq 0.50$, and $M/L2 \leq 0.50$, one may be satisfied, or a combination of two or more may be satisfied.

Figure 7:
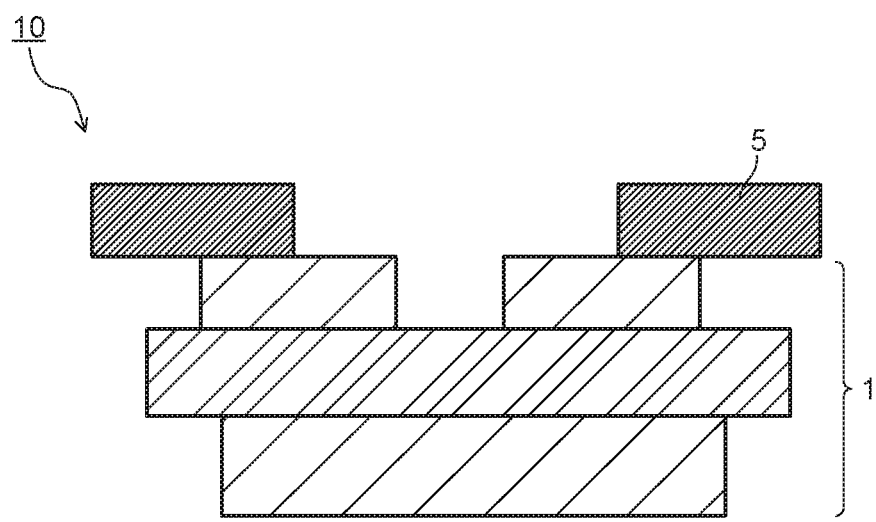
FIG. 7 is a side view illustrating an example of a lead-terminal-attached ceramic circuit board.
Figure 8:
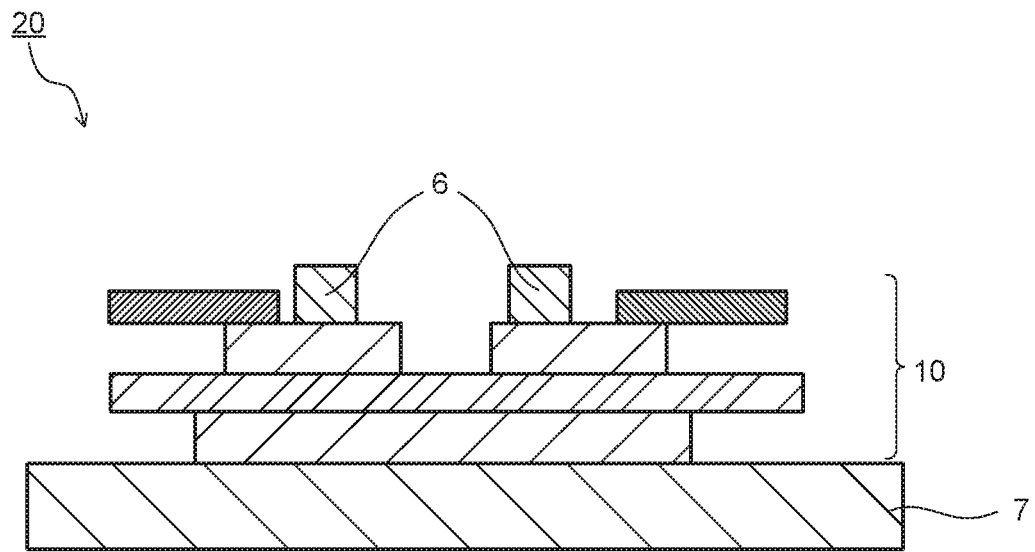
FIG. 8 is a side view illustrating an example of a semiconductor module.

The ceramic circuit board 1 is suitable as a lead-terminal-attached ceramic circuit board. FIG. 7 is a view illustrating an example of the lead-terminal-attached ceramic circuit board. FIG. 8 is a view illustrating an example of a semiconductor module. FIG. 7 and FIG. 8 illustrate the ceramic circuit board 1, lead terminals 5, semiconductor elements 6, a heat dissipation member 7, a lead-terminal-attached ceramic circuit board 10, and a semiconductor module 20.

The lead-terminal-attached ceramic circuit board 10 includes: the ceramic circuit board 1, the front metal plates 3 joined to the ceramic circuit board 1, the lead terminals 5 joined to the front metal plates 3. The lead terminals 5 have a function as external electrodes for conducting electricity to the outside. Examples of the shape of the lead terminals 5 include a lead frame shape and a lead pin shape. The number of the joined lead terminals 5 is not limited. The lead terminals and wire bonding may be co-used as required.

The lead-terminal-attached ceramic circuit board 10 is suitable for a structure in which the lead terminals 5 with a 0.2 mm thickness or more are joined to the front metal plates 3. The thickness of the lead terminals 5 is preferably 0.2 mm or more, and more preferably 0.4 mm or more. Note that the thickness of the lead terminal 5 is defined as the thickness of a lead frame plate in the case of the lead frame type, and as the width of a lead pin in the case of the lead pin type. The lead terminals 5 preferably contain a high conductivity material such as copper, aluminum, or an alloy thereof. Examples of a method to join the front metal plates 3 and the lead terminals 5 include soldering, brazing, ultrasonic joining, and press joining. Thickening the lead terminals 5 makes it possible to increase ampacity and reduce inductance. This makes it possible to make good use of advantages of the high-performance semiconductor elements.

In the lead-terminal-attached ceramic circuit board 10, differences Z between the maximum values and the minimum values of waviness profiles can be reduced to 40 µm or less. Joining the lead terminals 5 having a 0.2 mm thickness or more causes the front metal plates 3 to be partially thick. In such a structure, the waviness of the ceramic substrate 2 is large. The ceramic substrate 2 has the predetermined waviness along the long side or the short side. Consequently, it is possible to cancel out the waviness caused by the joining of the lead terminals 5. As a result, it is possible to reduce the differences Z between the maximum values and the minimum values of the waviness profiles of the lead-terminal-attached ceramic circuit board to 40 µm or less, and further to 20 µm.

An upper limit of the thickness of the lead terminals is not limited, but is preferably 3 mm or less. If lead pins with a thickness of not less than 0.2 mm nor more than 3 mm are used, the waviness can be made small even if they are joined to arbitrary places of the surfaces of the front metal plates 3. Reducing the waviness of the ceramic substrate 2 enables an improvement in mountability on the heat dissipation member 7.

The semiconductor module 20 includes the lead-terminal-attached ceramic circuit board 10, the semiconductor elements 6 mounted on the lead-terminal-attached ceramic circuit board 10, and the heat dissipation member 7. The semiconductor elements 6 are joined to the front metal plates 3. The number of the mounted semiconductor elements 6 and places where they are mounted are arbitrary, provided that they are mounted on the front metal plates 3.

The heat dissipation member 7 is a member where to mount the rear metal plate 4. The heat dissipation member 7 is provided on the rear metal plate 4. Examples of the heat dissipation member 7 include a heat sink, a base plate, and a cooling fin. The heat dissipation member 7 may have any of various shapes such as a plate shape, a comb-teeth shape, a groove shape, and a pin shape. As the heat dissipation member 7, a member containing a material having a good heat dissipation property, such as copper, Al, or AlSiC, is used.

Between the heat dissipation member 7 and the rear metal plate 4, an interposed layer such as solder or grease may be provided. Owing to the small differences Z between the maximum values and the minimum values of the waviness profiles of the lead-terminal-attached ceramic circuit board 10, a gap between the heat dissipation member 7 and the rear metal plate 4 is small. This eliminates the uneven application of the interposed layer such as solder or grease. Accordingly, it is possible to prevent poor mounting such as displacement or the protrusion of the interposed layer.

The semiconductor module 20 may have a mounting structure such as a screwing structure which applies a stress to the ceramic circuit board. Even the screwing structure can improve adhesion between the heat dissipation member 7 and the rear metal plate 4 owing to the small gap therebetween. This can reduce stress concentration at the time of the screwing, enabling a reduction in the poor mounting.

The improvement in the adhesion between the heat dissipation member 7 and the rear metal plate 4 leads to an improvement in the heat dissipation property. The improvement in the heat dissipation property leads to an improvement in the TCT characteristics as the semiconductor module. With the performance improvement of semiconductor elements, the operation guaranteed temperature increases to 175° C. or higher. Studies are made on thickening the metal plates and thinning the ceramic substrate 2 in order to improve the heat dissipation property. By being given the predetermined waviness profiles, the ceramic circuit board according to the embodiment can have an improved heat dissipation property even if structured to have the lead terminals attached thereto.

Figure 9:
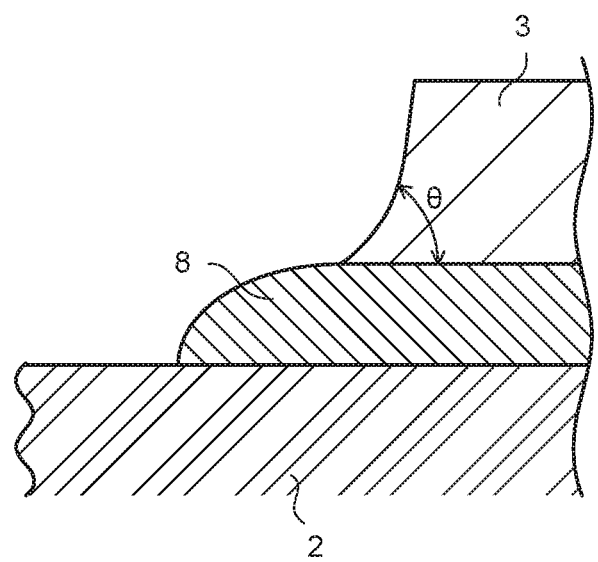
FIG. 9 is a view illustrating an example of shapes of a metal plate side surface and a joining layer.

In order to improve the TCT characteristics, the ceramic substrate 2 and each of the metal plates are preferably joined with a joining layer therebetween. FIG. 9 is a view illustrating an example of the shapes of a metal plate side surface and the joining layer. FIG. 9 illustrates the ceramic substrate 2, the metal plate (front metal plate 3), the joining layer 8, and a contact angle θ between the joining layer and the metal plate side surface. In FIG. 9, the front metal plate 3 is illustrated as an example, but the same applies to the rear metal plate 4.

The joining layer preferably contains active metal. The active metal contains at least one element selected from Ti (titanium), Zr (zirconium), Hf (hafnium), Nb (niobium), and Al (aluminum). A brazing material paste containing the active metal is used for the joining. When the metal plate is a copper plate (including a copper alloy plate), at least one element selected from Ti (titanium), Zr (zirconium), Hf (hafnium), and Nb (niobium) is preferably contained. Out of these active metals, Ti is preferable. Further, the joining layer containing any of these active metals preferably contains an active metal brazing material containing not less than 40% by mass nor more than 80% by mass Ag, not less than 20% by mass nor more than 60% by mass Cu, not less than 0.1% by mass nor more than 12% by mass active metal, not less than 0% by mass nor more than 20% by mass Sn, and not less than 0% by mass nor more than 20% by mass In, with the total content of these being 100% by mass or less. When the metal plate is an aluminum plate (including an aluminum alloy plate), a brazing material whose main component is Al is used. The Al brazing material preferably contains not less than 0.1% by mass nor more than 12% by mass Si.

The joining layer 8 preferably has a joining layer protruding portion protruding from between the ceramic substrate 2 and the metal plate 3. This joining layer protruding portion is preferably provided in an area up to not less than 10 μm nor more than 100 μm from the end portion of the metal plate. Further, the contact angle θ between the joining layer 8 and the side surface of the metal plate 3 is preferably 80 degrees or less, and more preferably 60 degrees or less. Controlling the joining layer protruding portion and the contact angle θ enables an improvement in the TCT characteristics. In particular, it is possible to improve the TCT characteristics as the lead-terminal-attached ceramic circuit board. The shapes of the joining layer protruding portion and the metal plate side surface can be controlled using etching.

When necessary, resin sealing may be performed. As a resin sealing process, a method such as a transfer molding method can be employed. In the semiconductor module according to the embodiment, since the thick lead terminals are joined, the lead terminals do not break in the resin sealing process. On the other hand, in wire bonding, since wires are thin, a method with a high mold pressure such as the transfer molding method is likely to cause wire breakage. In other words, the use of the thick lead terminals makes it possible to achieve a module structure that is easily resin-sealed.

Next, a method of manufacturing the above-described ceramic circuit board will be described. The method of manufacturing the ceramic circuit board is not limited, provided that the ceramic circuit board includes the above-described structure, but the following methods are usable as a method with good yields.

A first manufacturing method is a method in which a ceramic compact (green sheet) is sintered after worked in order to obtain the intended waviness profiles. Examples of a working method include metal mold pressing using a metal mold having waviness for obtaining the intended waviness profiles. One method is to use the metal mold having the waviness for obtaining the intended waviness profiles when the green sheet is punched out. Another method is to use the metal mold having the waviness for obtaining the intended waviness profiles in a drying process after the punching.

A second manufacturing method is a method in which waviness is imparted to the ceramic substrate after it is sintered, in order to obtain the intended waviness profiles. A warp correction process of an ordinary ceramic substrate heats the substrate while applying a load, thereby flattening the substrate. An effective method in this case is a method in which the heating is performed while the load is applied by a mold having waviness for obtaining the intended waviness profiles.

A third manufacturing method is a method in which waviness for obtaining the intended waviness profiles is imparted in a process of joining the metal plates and the ceramic substrate. When the metal plates and the ceramic substrate are joined, a tensile stress is applied to the metal plates. Applying the tensile stress to the metal plates causes the metal plates to contract in the joining process, so that the waviness is imparted to the ceramic substrate. Examples of the method to apply the tensile stress to the metal plates include honing.

A fourth manufacturing method is to perform honing from above the metal plates of the ceramic circuit board. Performing the honing linearly makes it possible for a honed portion to have a projecting shape.

A fifth manufacturing method is a method in which a volume ratio of the front and rear metal plates is controlled. The first to fifth manufacturing methods described above each may be performed alone, or they may be performed in combination.

The first manufacturing method is effective especially for a thin ceramic substrate having a 0.4 mm thickness or less. If the ceramic substrate has a large thickness of 0.6 mm or more, the ceramic compact contracts greatly in the sintering process, making it difficult to control the waviness profiles.

Similarly to the first manufacturing method, the second manufacturing method is effective especially for a thin ceramic substrate having a 0.4 mm thickness or less. An attempt to impart waviness to a ceramic substrate having a 0.6 mm thickness or more may result in breakage of the substrate. In particular, a substrate having a strength of 400 MPa or less and having a 0.6 mm thickness or more lacks flexibility and easily breaks.

The third manufacturing method is effective especially for a thick metal plate having a 0.6 mm thickness or more. If the metal plate has a small thickness of 0.3 mm or less, the tensile stress does not easily become large and the waviness may not be imparted sufficiently.

The fourth manufacturing method is effective especially for a thick metal plate having a 0.6 mm thickness or more. If the metal plate has a small thickness of 0.3 mm or less, the tensile stress does not easily become large, and the waviness may not be given sufficiently.

The fifth manufacturing method is effective when there is a difference in thickness between the front and rear metal plates. Therefore, a combination of a silicon nitride substrate having a 0.33 mm thickness or less and a metal plate (for example, a copper plate) having a 0.6 mm thickness or more is an easily fabricated combination.

The method to join the ceramic substrate and the metal plate may be either the method of joining them with the joining layer interposed therebetween or the joining method of directly joining them without the joining layer therebetween. The joining method with the joining layer therebetween is preferably an active metal joining method. The active metal joining method is a method using an active metal brazing material containing an active metal.

The active metal preferably contains at least one element selected from Ti (titanium), Zr (zirconium), Hf (Hafnium), Nb (niobium), and Al (aluminum). When the metal plate is a copper plate (including a copper alloy plate), at least one element selected from Ti (titanium), Zr (zirconium), Hf (hafnium), and Nb (niobium) is preferably contained. Out of these active metals, Ti is preferable.

For forming the joining layer containing the aforesaid active metal, it is preferable to use an active metal brazing material containing not less than 40% by mass nor more than 80% by mass Ag, not less than 20% by mass nor more than 60% by mass Cu, not less than 0.1% by mass nor more than 12% by mass active metal, not less than 0% by mass nor more than 20% by mass Sn, and not less than 0% by mass nor more than 20% by mass In, with the total contents of these being 100% by mass or less. The active metal brazing material containing Ti reacts with a nitride ceramic (a silicon nitride substrate, an aluminum nitride substrate) to form TiN. Consequently, it is possible to improve joining strength. When the metal plate is an aluminum plate (including an aluminum alloy plate), a brazing material whose main component Al is used. The Al brazing material preferably contains not less than 0.1% by mass nor more than 12% by mass Si.

An active metal brazing material paste is applied on the ceramic substrate, and the metal plate is placed thereon. The application thickness of the active metal brazing material paste is preferably not less than 10 μm nor more than 40 μm. The joining process is preferably performed at a temperature of not lower than 600° C. nor higher than 950° C. In the case where the active metal contains at least one element selected from Ti, Zr, Hf, and Nb, the joining process is preferably performed at a temperature of not lower than 800° C. nor higher than 950° C. In the case where the active metal contains Al, the joining process is preferably performed at a temperature of not lower than 600° C. nor higher than 800° C. A heating atmosphere is preferably a non-oxidizing atmosphere. The pattern shape may be formed by etching as required. By etching the side surface of the metal plate, it is possible to control the contact angle θ between the protruding portion of the joining layer and the metal plate.

The ceramic substrate and the metal plate may be joined by the direct joining method of joining without the joining layer therebetween. In a case where the metal plate is a copper plate, it is possible to use a direct joining method using a eutectic of copper and oxygen. In a case where the ceramic substrate is a nitride, the joining is performed, with an oxide film being formed on its surface. In a case where the metal plate is an Al plate, they are directly joined using an AlSi alloy plate.

By performing the above-described process, it is possible to control the waviness profiles of the ceramic substrate, and for example, it is possible for the waviness profile of the long side or the short side of the ceramic substrate to have the substantially arc shape and for the waviness profile of the other to have the substantially M-shape or the substantially S-shape. Further, by adjusting conditions of the first to third manufacturing methods, it is possible to adjust the differences Z between the maximum values and the minimum values of the waviness profiles.

Next, a method of manufacturing the aforesaid lead-terminal-attached ceramic circuit board will be described. The lead-terminal-attached ceramic circuit board is manufactured by joining the lead terminals to the above-described ceramic circuit board.

Examples of the lead terminals include lead-frame-type lead terminals and lead-pin-type lead terminals. Examples of the shape of the lead terminals include a plate shape, a pin shape, an S-shape, and an L-shape. The lead terminals preferably contain copper, Al, or an alloy thereof.

The lead terminals are joined to the front metal plates of the ceramic circuit board. Examples of a method to join the lead terminals and the front metal plates include a method using a joining material, ultrasonic joining, and a pressing joining method. Examples of the joining material include solder and a brazing material.

By imparting the predetermined waviness profiles to the ceramic circuit board, it is possible to prevent the ceramic substrate from curving when the thickness of the lead terminals increases to 0.2 mm or more, and further 0.4 mm or more. Accordingly, in the lead-terminal-attached ceramic circuit board, the differences Z between the maximum values and the minimum values of the waviness profiles of the long side and the short side can be reduced to 40 μm or less, and further 20 μm or less.

As previously described, it is preferable to impart one or two or more of $0.50 \leq \Sigma M_n/L1 \leq 0.95$, $0.10 \leq \Sigma M_m/L2 \leq 0.95$, $M/L1 \leq 0.5$, and $M/L2 \leq 0.5$. By satisfying such ranges, it is possible to control the waviness profiles even when the number of the front metal plates 3 is three or more. For example, by joining two or more front metal plates 3 and providing a gap between the metal plates, the extreme values of the waviness profiles are easily given. Even if the creepage distance of the ceramic substrate 2 and the front metal plates 3 is set to as narrow as not less than 1 mm nor more than 2 mm, it is possible to impart the predetermined waviness profiles.

Next, a method of manufacturing the semiconductor module will be described. The method of manufacturing the semiconductor module includes a step of mounting the semiconductor elements on the lead-terminal-attached ceramic circuit board and a step of mounting the resultant onto the heat dissipation member.

In the step of mounting the semiconductor elements, the semiconductor elements are mounted on the front metal plates. The semiconductor elements are preferably joined using a joining layer such as solder. In the step of mounting on the heat dissipation member, the rear metal plate of the ceramic circuit board is mounted on the heat dissipation member. Grease, solder, a brazing material, or the like may be interposed between the rear metal plate and the heat dissipation member as required.

The ceramic substrate may be screwed as required. Examples of the screwing structure include a structure in which a screw hole is provided in the ceramic substrate and a structure in which the end portion of the ceramic substrate is fixed with a pressing jig and is screwed.

In the lead-terminal-attached ceramic circuit board, the differences Z between the maximum values and the minimum values of the waviness profiles of the long side and the short side are small. This makes it possible to make the gap between the rear metal plate and the heat dissipation member small when the lead-terminal-attached ceramic circuit board is mounted on the heat dissipation member. Accordingly, it is possible to improve the heat dissipation property between the rear metal plate and the heat dissipation member.

Even if a fixing method such as the screwing which applies a stress to the ceramic substrate is performed in order to improve adhesion between the rear metal plate and the heat dissipation member, poor mounting such as displacement or breakage is difficult to occur. The resin sealing process may be performed as required. Examples of the resin sealing process include a transfer molding method. The transfer molding method is a sealing method in which a mold pressure is increased to improve mass productivity. By joining the lead terminals having a 0.2 mm thickness or more, it is possible to prevent the breakage of the lead terminals during the transfer molding process. In other words, the lead-terminal-attached ceramic circuit board and the semiconductor module using the same are suitable for the transfer molding process.

EXAMPLES

Examples 1 to 8, Comparative Examples 1 to 3

Silicon nitride circuit boards shown in Table 1 were fabricated. As silicon nitride substrates, silicon nitride substrates having a heat conductivity of 90 W/m·K and having a three-point bending strength of 700 MPa were prepared. As front metal plates and rear metal plates, copper plates were prepared. The silicon nitride substrates were each joined to the copper plates using an active metal brazing material containing Ti. As the active metal brazing material, a brazing material composed of Ag (balance), Cu (30% by mass), Ti (5% by mass), and Sn (10% by mass) was used. An active metal brazing paste was applied with a 20 μm thickness, and the silicon nitride substrates were each joined to the copper plates by 850° C. heating in a non-oxidizing atmosphere. After the copper plates were each joined, the size of a joining layer protruding portion and a contact angle θ between a copper plate side surface end portion and the joining layer protruding portion were adjusted by etching. The length of the joining layer protruding portion was adjusted to 20 to 40 μm, and the contact angle θ between the copper plate side surface end portion and the joining layer protruding portion was adjusted to 40 to 60 degrees. The distance between the copper plates as the front copper plates was set to 1.5 to 3.0 mm. The creepage distance of the front copper plates and the ceramic substrate was unified to 1.5 mm. In Examples, as a waviness imparting step, the second manufacturing method (method to impart the intended waviness to the ceramic substrate) or the fourth manufacturing method (linearly performing the honing on the metal plate) was performed. In Comparative Example 1, waviness was eliminated by a warp correction process. Further, in Comparative Examples 2, 3, waviness was imparted by the same method as in Examples.

TABLE 1

| | Silicon Nitride Substrate | | | Front Metal Plate | | Rear Metal Plate |
|---|---|---|---|---|---|---|
| | L1 (mm) | L2 (mm) | Thickness (mm) | Length × Width (mm) × Thickness (mm) | Number | Length × Width (mm) × Thickness (mm) |
| Example 1 | 50 | 30 | 0.32 | 22 × 27 × 0.8 | 2 | 47 × 27 × 0.8 |
| Example 2 | 40 | 30 | 0.32 | 17.5 × 27 × 0.8 | 2 | 37 × 27 × 0.7 |
| Example 3 | 60 | 30 | 0.32 | 27.5 × 27 × 0.8 | 2 | 57 × 27 × 0.8 |
| Example 4 | 50 | 35 | 0.25 | 22.75 × 32 × 0.8 | 2 | 47 × 32 × 0.6 |
| Example 5 | 45 | 35 | 0.25 | 20.25 × 32 × 0.8 | 2 | 42 × 32 × 0.8 |
| Example 6 | 50 | 30 | 0.20 | 47 × 14 × 0.8 | 1 | 47 × 27 × 0.8 |
| | | | | 22.75 × 4 × 0.8 | 4 | |
| Example 7 | 50 | 35 | 0.25 | 47 × 10 × 0.8 | 1 | 47 × 32 × 0.6 |
| | | | | 22.75 × 10 × 0.8 | 4 | |
| Example 8 | 40 | 30 | 0.25 | 17.75 × 12 × 0.8 | 2 | 37 × 27 × 0.7 |
| | | | | 37 × 8 × 0.8 | 1 | |
| | | | | 17.75 × 5.5 × 0.8 | 2 | |
| Comparative Example 1 | 50 | 30 | 0.32 | 22 × 27 × 0.8 | 2 | 47 × 27 × 0.8 |
| Comparative Example 2 | 50 | 30 | 0.32 | 22 × 27 × 0.8 | 2 | 47 × 27 × 0.8 |
| Comparative Example 3 | 50 | 30 | 0.32 | 22 × 27 × 0.8 | 2 | 47 × 27 × 0.8 |

$\Sigma M_n/L1$, $\Sigma M_m/L2$, M/L1, and M/L2 were measured in the ceramic circuit boards according to Examples and Comparative Examples. They were measured along a long side (L1 side) and a short side (L2 side) of each of the ceramic substrates, based on the front metal plates closest to creepage distances. M/L1 and M/L2 had the largest values when metal plates different in size were joined. Table 2 shows the results.

TABLE 2

| | Front Metal Plate | | | |
|---|---|---|---|---|
| | Long Side | | Short Side | |
| | $\Sigma M_n/L1$ | M/L1 | $\Sigma M_m/L2$ | M/L2 |
| Example 1 | 0.88 | 0.44 | 0.9 | 0.9 |
| Example 2 | 0.88 | 0.44 | 0.9 | 0.9 |
| Example 3 | 0.92 | 0.46 | 0.9 | 0.9 |
| Example 4 | 0.91 | 0.46 | 0.91 | 0.91 |
| Example 5 | 0.9 | 0.45 | 0.91 | 0.91 |
| Example 6 | 0.91 | 0.46 | 0.73 | 0.47 |
| Example 7 | 0.91 | 0.46 | 0.86 | 0.29 |
| Example 8 | 0.89 | 0.44 | 0.85 | 0.4 |
| Comparative Example 1 | 0.88 | 0.44 | 0.9 | 0.9 |
| Comparative Example 2 | 0.88 | 0.44 | 0.9 | 0.9 |
| Comparative Example 3 | 0.88 | 0.44 | 0.9 | 0.9 |

As is seen from Table 2, the silicon nitride circuit boards according to Examples satisfied one of or two or more of $0.50 \leq \Sigma M_n/L1 \leq 0.95$, $0.50 \leq \Sigma M_m/L2 \leq 0.95$, $M/L1 \leq 0.5$, and $M/L2 \leq 0.5$.

Next, waviness profiles of the long side and the short side of each of the ceramic circuit boards according to Examples and Comparative Examples were measured. In the measurement of each of the waviness profiles, a portion 1 mm inward from an end portion of the ceramic substrate was laser-scanned. From the measurement results, the waviness profiles were found according to JIS-B0601. Further, differences Z between the maximum values and the minimum values of the waviness profiles were also measured. Table 3 shows the results.

TABLE 3

|  | First Waviness Profile | | Second Waviness Profile | |
| --- | --- | --- | --- | --- |
|  | Shape | Z (μm) | Shape | Z (μm) |
| Example 1 | Substantially Arc-Shaped | 40 | Substantially M-Shaped | 50 |
| Example 2 | Substantially Arc-Shaped | 50 | Substantially S-Shaped | 50 |
| Example 3 | Substantially Arc-Shaped | 60 | Substantially M-Shaped | 50 |
| Example 4 | Substantially Arc-Shaped | 70 | Substantially M-Shaped | 60 |
| Example 5 | Substantially Arc-Shaped | 100 | Substantially M-Shaped | 80 |
| Example 6 | Substantially Arc-Shaped | 150 | Substantially M-Shaped | 120 |
| Example 7 | Substantially Arc-Shaped | 120 | Substantially M-Shaped | 70 |
| Example 8 | Substantially Arc-Shaped | 110 | Substantially M-Shaped | 80 |
| Comparative Example 1 | Substantially Linear | 3 | Substantially Linear | 3 |
| Comparative Example 2 | Substantially Arc-Shaped | 10 | Substantially Arc-Shaped | 20 |
| Comparative Example 3 | Substantially Arc-Shaped | 20 | Substantially Arc-Shaped | 20 |

Lead terminals were joined to each of the ceramic circuit boards according to Examples and Comparative Examples. As the lead terminals, lead terminals indicated in Table 4 were used. The lead terminals used were all made of copper. Lead frame type indicates a flat plate shape, and a lead pin type indicates a columnar shape. In the case of the lead pin type, the thickness of the lead terminal is the diameter.

TABLE 4

|  | Shape | Size |
| --- | --- | --- |
| Lead Terminal 1 | Lead Frame Type | Length 10 mm × Width 3 mm × Thickness 0.5 mm |
| Lead Terminal 2 | Lead Frame Type | Length 8 mm × Width 2 mm × Thickness 0.8 mm |
| Lead Terminal 3 | Lead Pin Type | Length 5 mm × Diameter 2 mm |

Next, the lead terminals shown in Table 4 were joined to the ceramic circuit boards according to Examples and Comparative Examples. The number of the joined lead terminals indicates the number of the lead terminals joined to one front metal plate. That is, since the number of the front metal plates is two, the actual connection number is twice. For example, in Example 1, two lead terminals 1 were joined to one metal plate. In Example 1, since two front metal plates are provided, the total number of the connected lead terminals 1 is four. Thereafter, differences Z between the maximum values and the minimum values of a waviness profile along a long side (first waviness profile) and a waviness profile along a short side (second waviness profile) were measured. Table 5 shows the results.

TABLE 5

|  | Type of Lead Terminal | Number of Connected Lead Terminals per Front Metal Plate | Z (μm) of First Waviness Profile | Z (μm) of Second Waviness Profile |
| --- | --- | --- | --- | --- |
| Example 1 | Lead Terminal 1 | 2 | 20 | 16 |
| Example 2 | Lead Terminal 2 | 2 | 16 | 15 |
| Example 3 | Lead Terminal 3 | 2 | 15 | 12 |
| Example 4 | Lead Terminal 2 | 2 | 10 | 8 |
| Example 5 | Lead Terminal 3 | 2 | 10 | 6 |
| Example 6 | Lead Terminal 2 | 4 | 12 | 8 |
| Example 7 | Lead Terminal 2 | 4 | 10 | 7 |
| Example 8 | Lead Terminal 2 | 4 | 13 | 9 |
| Comparative Example 1 | Lead Terminal 1 | 2 | 220 | 190 |
| Comparative Example 2 | Lead Terminal 1 | 2 | 150 | 120 |
| Comparative Example 3 | Lead Terminal 1 | 2 | 130 | 100 |

As is seen from the table, in the lead-terminal-attached ceramic circuit boards according to Examples, the differences Z between the maximum values and the minimum values of the waviness profiles had small values of 20 μm or less. On the other hand, in all of Comparative Examples, they had large values.

Next, confirmation tests of TCT characteristics and mountability were conducted on the lead-terminal-attached ceramic circuit boards according to Examples and Comparative Examples. In TCT, −40° C.×30 minutes→room temperature×10 minutes→175° C.×30 minutes→room temperature×10 minutes was one cycle, and an incidence of defects after 5000 cycles was measured. A 0% incidence of defects caused by TCT means no defect, and a 100% incidence of defects caused by TCT means that all are defective (occurrence of a crack in the joining layer or the ceramic substrate).

In the mountability confirmation test, an incidence of defects was measured at the time of screw-fixing to a heat dissipation member. At the time of the screw-fixing, grease was interposed between the rear metal plate and the heat dissipation member. Thermal resistance (K/W) was also measured. Table 6 shows the results.

TABLE 6

|  | Incidence of Defects After Tct (%) | Incidence of Defects in Mountability Confirmation Test (%) | Thermal Resistance (K/W) |
| --- | --- | --- | --- |
| Example 1 | 2 | 0 | 0.31 |
| Example 2 | 2 | 0 | 0.28 |
| Example 3 | 2 | 0 | 0.25 |
| Example 4 | 0 | 0 | 0.20 |

TABLE 6-continued

|  | Incidence of Defects After Tct (%) | Incidence of Defects in Mountability Confirmation Test (%) | Thermal Resistance (K/W) |
|---|---|---|---|
| Example 5 | 0 | 0 | 0.20 |
| Example 6 | 0 | 0 | 0.18 |
| Example 7 | 0 | 0 | 0.20 |
| Example 8 | 0 | 0 | 0.18 |
| Comparative Example 1 | 15 | 5 | 0.78 |
| Comparative Example 2 | 13 | 3 | 0.66 |
| Comparative Example 3 | 13 | 3 | 0.52 |

As is seen from the table, the lead-terminal-attached ceramic circuit boards according to Examples exhibited good results both in the TCT characteristics and mountability. On the other hand, Comparative Examples were inferior in the characteristics due to the large waviness. From this, it has been found that Examples are suitable for a ceramic circuit board to which thick lead terminals are joined. Excellent durability was exhibited even when the thickness of the silicon nitride substrates was reduced to 0.32 mm or less and further 0.25 mm or less.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A ceramic circuit board comprising:
   a ceramic substrate with a 1.0 mm thickness or less, the substrate including a first surface and a second surface, the first surface including a first area and a second area;
   a first metal plate joined to the first area with a first joining layer therebetween; and
   a second metal plate joined to the second surface with a second joining layer therebetween,
   wherein the first surface extends along a first direction and a second direction across the first direction,
   wherein the second area has a first waviness profile along a first side in the first direction of the first surface, the first waviness profile having one extreme value or less,
   wherein the second area has a second waviness profile along a second side in the second direction of the first surface, the second waviness profile having not less than two nor more than three extreme values,
   wherein the first joining layer has a first protrusion provided on the first surface and extending from a first interface between the first joining layer and the first metal plate, the first protrusion has a length of 10 µm or more and 100 µm or less, and the first interface and a side surface of the first metal plate define a first angle of 80 degrees or less therebetween, and
   wherein the second joining layer has a second protrusion provided on the second surface and extending from a second interface between the second joining layer and the second metal plate, the second protrusion has a length of 10 µm or more and 100 µm or less, and the second interface and a side surface of the second metal plate define a second angle of 80 degrees or less therebetween.

2. The ceramic circuit board according to claim 1,
   wherein the first waviness profile is substantially arc-shaped, and
   wherein the second waviness profile is substantially M-shaped or substantially S-shaped.

3. The ceramic circuit board according to claim 1, wherein each of the first and second metal plates has a thickness of 0.6 mm or more.

4. The ceramic circuit board according to claim 1, wherein a thickness of a metal plate having the largest thickness out of the first metal plate and the second metal plate is 1.5 times or less as large as the thickness of the ceramic substrate.

5. The ceramic circuit board according to claim 1, wherein a length of the first side is 1.25 times or more as long as a length of the second side.

6. The ceramic circuit board according to claim 1, wherein the ceramic substrate is a silicon nitride substrate having a thickness of 0.30 mm or less.

7. The ceramic circuit board according to claim 1, wherein a difference between a maximum value and a minimum value of at least one profile selected from the group consisting of the first and second waviness profiles is 10 µm or more.

8. The ceramic circuit board according to claim 1, further comprising a lead terminal with a 0.2 mm thickness or more, the lead terminal being joined to the first metal plate.

9. The ceramic circuit board according to claim 8, wherein a difference between a maximum value and a minimum value of at least one profile selected from the group consisting of the first and second waviness profiles is 40 µm or less.

10. A semiconductor module comprising:
    the ceramic circuit board according to claim 8;
    a semiconductor element provided on the first metal plate; and
    a heat dissipation member provided on the second metal plate.

11. The ceramic circuit board according to claim 1,
    wherein the first waviness profile is substantially arc-shaped,
    wherein the second waviness profile is substantially M-shaped or substantially S-shaped,
    wherein at least one plate selected from the group consisting of the first and second metal plates has a thickness of 0.6 mm or more, and
    wherein the ceramic substrate is a silicon nitride substrate having a thickness of 0.30 mm or less.

12. The ceramic circuit board according to claim 7,
    wherein the first waviness profile is substantially arc-shaped,
    wherein the second waviness profile is substantially M-shaped or substantially S-shaped,
    wherein at least one plate selected from the group consisting of the first and second metal plates has a thickness of 0.6 mm or more, and
    wherein the ceramic substrate is a silicon nitride substrate having a thickness of 0.30 mm or less.

13. The semiconductor module according to claim 10,
    wherein the first waviness profile is substantially arc-shaped,
    wherein the second waviness profile is substantially M-shaped or substantially S-shaped, wherein at least one plate selected from the group consisting of the first and second metal plates has a thickness of 0.6 mm or more, and wherein the ceramic substrate is a silicon nitride substrate having a thickness of 0.30 mm or less.

14. The ceramic circuit board according to claim 1, wherein the second area has two of the second waviness profiles, each second waviness profile is substantially M-shaped.

15. The ceramic circuit board according to claim 1, wherein the second area has two of the second waviness profiles, each second waviness profile is substantially S-shaped.

16. The ceramic circuit board according to claim 2, wherein the second area has two of the second waviness profiles, each second waviness profile is substantially M-shaped.

17. The ceramic circuit board according to claim 2, wherein the second area has two of the second waviness profiles, each second waviness profile is substantially S-shaped.

\* \* \* \* \*